US 6,534,415 B2

(12) United States Patent
Wang et al.

(10) Patent No.: US 6,534,415 B2
(45) Date of Patent: *Mar. 18, 2003

(54) METHOD OF REMOVING POLYMER RESIDUES AFTER TUNGSTEN ETCH BACK

(75) Inventors: Hsueh-Wen Wang, Taipei (TW); Tsan-Wen Liu, Hsinchu (TW)

(73) Assignee: United Microelectronics Corp., Hsinchu (TW)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/455,006

(22) Filed: Dec. 3, 1999

(65) Prior Publication Data

US 2001/0053611 A1 Dec. 20, 2001

(51) Int. Cl.$^7$ ............................................. H01L 21/302
(52) U.S. Cl. .................. 438/710; 438/720; 438/745; 438/754; 438/700

(58) Field of Search ................................ 438/700, 706, 438/710, 720, 745, 754

(56) References Cited

U.S. PATENT DOCUMENTS

| 5,656,545 A | * | 8/1997 | Yu .............................. 438/627 |
| 5,903,053 A | * | 5/1999 | Iijima et al. ................. 257/751 |
| 5,911,835 A | * | 6/1999 | Lee et al. .................... 134/1.3 |
| 6,268,287 B1 | * | 7/2001 | Young et al. ............... 438/671 |

* cited by examiner

Primary Examiner—Benjamin L. Utech
Assistant Examiner—Charlotte A. Brown
(74) Attorney, Agent, or Firm—J.C. Patents

(57) ABSTRACT

The invention describes a method for lowering particle count after tungsten etch back, in which method a plasma ashing step is performed after a brush cleaning step to eliminate polymer residues that remain on the metal barrier layer after tungsten etch back. Another tungsten etch back process is further performed to remove a tungsten oxide film that is formed by reacting the tungsten layer with an $O_2$ gas used in the plasma ashing step.

19 Claims, 2 Drawing Sheets

METHOD OF REMOVING POLYMER RESIDUES AFTER TUNGSTEN ETCH BACK

BACKGROUND OF THE INVENTION

1. Field of Invention

The present invention relates to a fabrication method for a metal via. More particularly, the present invention relates to a method of removing polymer residues after tungsten etch back.

2. Description of Related Art

In a multilevel metallization process, tungsten is a common material for manufacturing a metal plug due to its excellent conductivity and high conductivity. Tungsten has also been used to replace aluminum alloy for making the metal plug, since a tungsten layer formed by chemical vapor deposition (CVD) provides better step coverage than an aluminum alloy layer does.

FIG. 1 is a schematic diagram illustrating polymer residues that remain after a tungsten etching back is applied in the conventional fabrication method for a metal via.

Referring to FIG. 1, a first metal layer 100 that is formed on a metal oxide semiconductor (MOS) device (not shown) and a substrate (not shown) is provided. A dielectric layer 102 is formed and patterned to form an opening 102a, which exposes a part of the first metal layer 100. A conformal metal barrier layer 104 is then formed on the patterned dielectric layer 102 and covers the profile of the opening 102a, wherein the metal barrier layer 104 may include a TiN, layer. A blanket metal layer 106, preferably a tungsten layer, is formed on the metal barrier layer 104, wherein the method for forming the tungsten layer 106 includes chemical vapor deposition (CVD). A tungsten etch back is performed to remove a part of the tungsten layer 106 outside the opening 102a until the top surface of the tungsten layer 106 in the opening is level with the top surface of the metal barrier layer 104.

However, large polymer residues 108 are easily produced due to a reaction that occurs as a result of tungsten etch back and remain on the metal barrier layer 104. Following the method mentioned above, the polymer residues 108 that remain on the metal barrier layer 104 inevitably provide a large resistance which affects the reliability of the device. Thus, the overall yield from the metal via fabrication process is reduced. Conventionally, a brush cleaning is adopted to remove the polymer residues, but it is known by those skilled in art that the jet cleaning and brush cleaning cannot effectively remove such polymer residue defects. Other methods, such as chemical mechanical polishing (CMP), are performed to remove the polymer residues produced during tungsten etch back. However, there are problems associated with using CMP, including the possibility that the etching solvent involved in the tungsten CMP may attack the metal barrier layer 104 with respect to different etching selectivity when etching is performed for a long period of time. Since the process window in this case is too narrow to control, the polymer residues 108 may not be thoroughly removed if the etching time is reduced.

SUMMARY OF THE INVENTION

The invention provides a method for lowering particle count after tungsten etch back, which method is applicable to a multilevel metallization process. A first metal layer is provided, with a patterned dielectric layer formed thereon so as to form an opening that exposes a part of the first metal layer between the patterned dielectric layer. A conformal metal barrier layer is then formed on the patterned dielectric layer and covers the profile of the opening, followed by forming a blanket tungsten layer, which fills the opening and covers the metal barrier layer. A tungsten etch back process is performed to remove a part of the tungsten layer outside the opening until the top surface of the tungsten layer in the opening is level with the top surface of the metal barrier layer.

As embodied and broadly described herein, the invention provides a method for lowering particle count after tungsten etch back. The method includes a plasma ashing step which is performed to eliminate the polymer residues that remain on the metal barrier layer after tungsten etch back is performed. An additional tungsten etch back process is performed to remove a tungsten oxide film that is formed subsequently, since an $O_2$ gas involved in the plasma ashing step can cause oxidation reaction with the tungsten layer.

According to the present invention, the polymer residues produced after tungsten etch back are removed by performing plasma ashing, instead of by tungsten CMP which would damage the metal barrier layer. As a result, no large resistance is produced to affect the reliability of the device. Furthermore, tungsten etch back is performed after the plasma ashing step to remove the tungsten oxide film which increases the resistance of the metal via. Therefore, the overall yield from the fabrication process for the metal via is increased.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
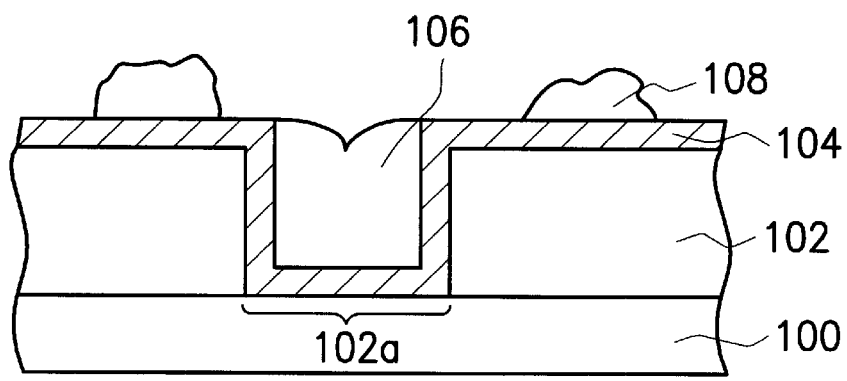
FIG. 1 is a schematic diagram illustrating polymer residues that remain after a tungsten etching back is applied in the conventional fabrication method for a metal plug.
Figure 2A:
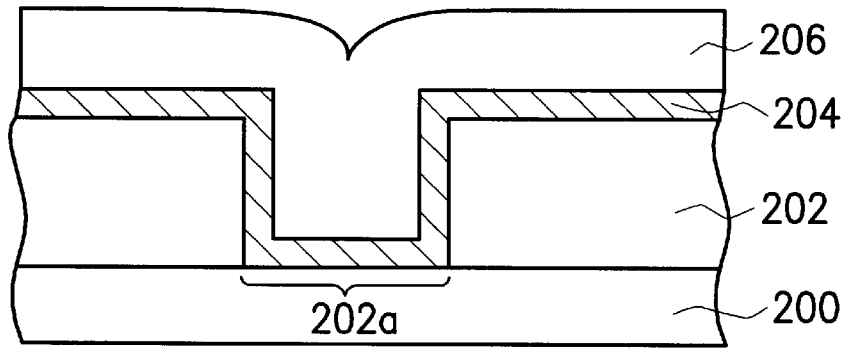
FIGS. 2A to 2D are schematic diagrams illustrating the fabrication process for a metal via according to one preferred embodiment of this invention.

Referring to FIG. 2A, a first metal layer 200 formed on a metal oxide semiconductor (MOS) device (not shown) and a substrate (not shown) is provided. A dielectric layer 202 is formed and patterned to form an opening 202a, which exposes a part of the first metal layer 200. A conformal metal barrier layer 204 is then formed on the patterned dielectric layer 202 and covers the profile of the opening 202a, wherein the metal barrier layer 204 may include a $TiN_x$ layer. A blanket metal layer 206, preferably a tungsten layer, is formed on the metal barrier layer 204, wherein the method for forming the tungsten layer 206 includes chemical vapor deposition (CVD).

Figure 2B:
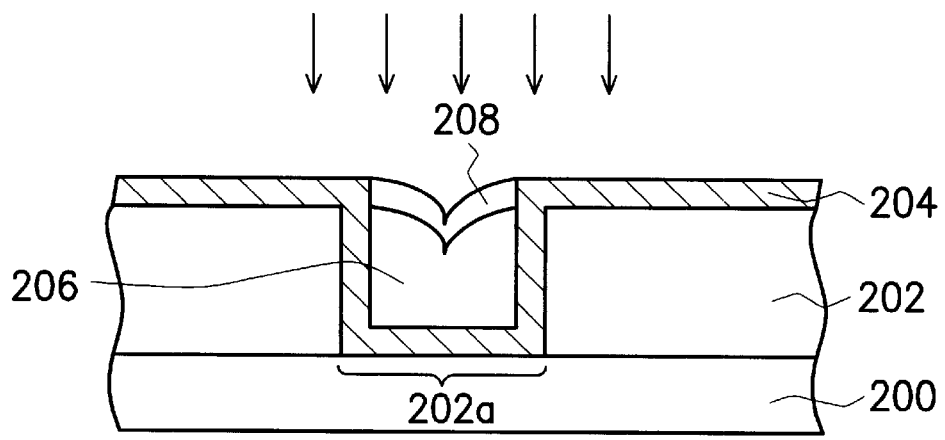

Referring to FIG. 2B, a tungsten etch back process is performed to remove a part of the tungsten layer 206 outside the opening 202a until the top surface of the tungsten layer 206 in the opening is level with the top surface of the metal barrier layer 204. As a result, the tungsten layer 206 in the opening 202a forms the tungsten plug 206a. A brush cleaning step is initially performed for removing the large polymer residues that conventionally remain on the metal barrier layer 204 after tungsten etch back, followed by a plasma ashing step which uses a plasma asher to remove the polymer residues, wherein the plasma asher includes use of $O_2$ gas. Preferably, the plasma ashing step in the invention is performed with a power of about 1000–1200 W, and a pressure of about 1200–1600 mTorrs. Since $O_2$ gas is used in the plasma ashing step, the top surface of the tungsten plug 206a is oxidized to form a tungsten oxide film 208, wherein the tungsten oxide film 208 in this case has a thickness of about 200–600 angstroms.

Figure 2C:
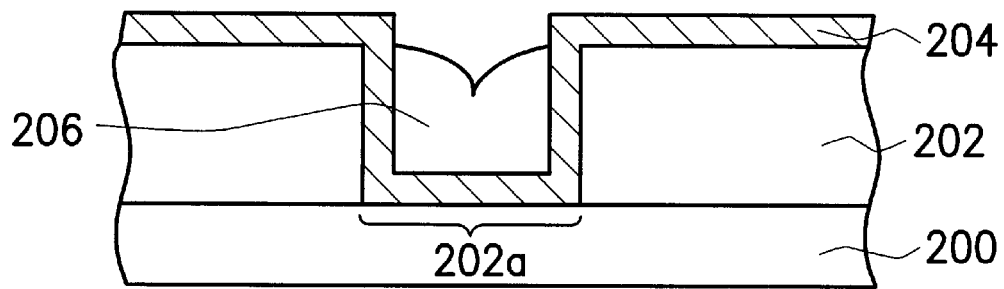

Referring to FIG. 2C, the tungsten oxide film 208 is removed by tungsten etch back. The method for removing the tungsten oxide film 208 involves performing an over etching for about 1–10 seconds to ensure that the tungsten oxide film 208 is completely removed from the tungsten plug 206a in the opening 202a.

Figure 2D:
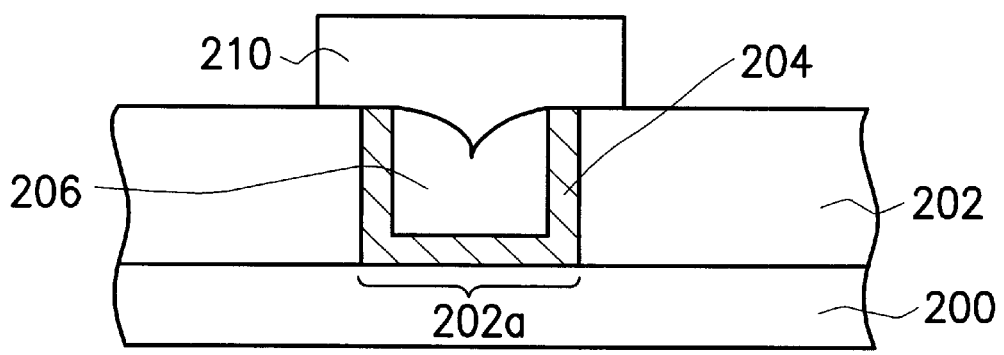

Referring to FIG. 2D, the metal barrier layer 204 above the dielectric layer 202 is removed until the dielectric layer is exposed. A patterned second metal layer 210 is then formed to cover a part of the exposed dielectric layer 202 and the metal barrier layer 204, so that the patterned second metal layer 210 is connected to the tungsten plug 206a. The method for forming the patterned second metal layer 210 involves globally depositing the metal layer on the dielectric layer 202, the metal barrier layer 204, and the tungsten plug 206a. A conventional photolithography and etching which removes a part of the second metal layer on the dielectric layer 202 is then performed.

Summarizing the above, it is understood that the polymer residues produced after tungsten etch back are removed during the plasma ashing step, instead of by tungsten CMP which damages the metal barrier layer. As a result, no large resistance is provided from the polymer residue to affect the reliability of the device. Furthermore, the tungsten etch back is performed after the plasma ashing step to remove the tungsten oxide film which increases the resistance of the metal via. Therefore, the overall yield from the fabrication process for the metal via is increased.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for removing polymer residues after tungsten etch back, applicable to a multilevel metallization process, the method comprising steps of:

providing a first metal layer which is formed on a metal oxide semiconductor (MOS) device and a substrate;

forming a patterned dielectric layer on the first metal layer to cover the dielectric layer having an opening therein, which opening exposes a part of the metal layer;

forming a conformal metal barrier layer to cover the dielectric layer and a profile of the opening;

forming a tungsten layer on the conformal metal barrier layer so as to fill the opening;

removing a part of the tungsten layer outside the opening until a top surface of the tungsten layer in the opening is level with top surface of the metal barrier layer;

performing a brush cleaning process so as to remove polymer residues that remain on the metal barrier layer after removal of the tungsten layer;

performing a plasma ashing process using a plasma containing oxygen, after the brush cleaning process to further remove remaining polymer residues on the metal barrier layer, wherein the top surface of the tungsten layer in the opening is oxidized to form a tungsten oxide film; and removing the tungsten oxide film by performing a tungsten etch back process.

2. The method of claim 1, wherein the metal barrier layer includes a TiN layer.

3. The method of claim 1, wherein the step of forming a tungsten layer on the conformal metal barrier layer includes chemical vapor deposition (CVD).

4. The method of claim 1, wherein the step of removing a part of the tungsten layer outside the opening includes tungsten etch back.

5. The method of claim 1, wherein the plasma ashing step includes an oxidizing step.

6. The method of claim 5, wherein the oxidizing step is performed under a condition comprising a power of about 1000–1200 Watts and a pressure of about 1100–1700 mtorrs.

7. The method of claim 6, wherein the oxidizing step is performed using a plasma asher.

8. The method of claim 7, wherein the plasma asher includes use of $O_2$ gas.

9. The method of claim 1, wherein the tungsten etch back process is performed for about 1–10 seconds.

10. The method of claim 9, wherein the tungsten oxide film has a thickness of about 200–600 angstroms.

11. A fabrication method for a metal via, applicable to a multilevel metallization process, the method comprising steps of:

providing a first metal layer which is formed on a MOS device and a substrate;

forming a patterned dielectric layer on the first metal layer, the patterned dielectric layer having an opening therein, which opening exposes a part of the metal layer;

forming a conformal $TiN_x$ layer to cover the dielectric layer and a profile of the opening forming a tungsten layer the conformal $TiN_x$ so as to fill the opening;

removing a part of the tungsten layer outside the opening until a top surface of the layer in the opening is level with a top surface of the $TiN_x$ layer;

performing a plasma ashing step using a plasma containing oxygen to remove mass polymer residues on the metal barrier layer after the step of removing a part of tungsten layer outside the opening, wherein the top surface of the tungsten layer in the opening is oxidized to form a tungsten oxide film;

removing the tungsten oxide film until the tungsten layer thereunder is exposed;

removing a part of the $TiN_x$ layer that covers a top surface of the dielectric layer; and forming a patterned second metal layer to cover the exposed tungsten layer and a part of the dielectric layer so as to complete a manufacture of the metal via.

12. The fabrication method of claim 11, wherein the step of forming a tungsten layer on the conformal $TiN_x$ layer includes CVD.

13. The fabrication method of claim 11, wherein the step of removing a part of the tungsten layer outside the opening includes tungsten etch back.

14. The fabrication method of claim 11, wherein the plasma ashing step is performed under a condition comprising a power of about 1000–1200 Watts and a pressure of about 1100–1700 mtorrs.

15. The fabrication method of claim 14, wherein the plasma ashing step is performed using a plasma asher.

16. The fabrication method of claim 15, wherein the plasma asher includes use of $O_2$ gas.

17. The fabrication method of claim 11, wherein the step of removing the tungsten oxide film involves performing tungsten etch back for about 1–10 seconds.

18. The fabrication method of claim 17, wherein the tungsten oxide film has a thickness of about 200–600 angstroms.

19. The fabrication method of claim 11, further comprising a brush cleaning step before performing the plasma ashing step.

* * * * *